(12) United States Patent
Shimizu et al.

(10) Patent No.: US 6,495,418 B2
(45) Date of Patent: Dec. 17, 2002

(54) METHOD OF MANUFACTURING A SEMICONDUCTOR DEVICE HAVING A CAPACITOR

(75) Inventors: Masahiro Shimizu, Hyogo (JP);
Takashi Miyajima, Hyogo (JP);
Toshinori Morihara, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1 day.

(21) Appl. No.: 09/754,120

(22) Filed: Jan. 5, 2001

(65) Prior Publication Data

US 2002/0019089 A1 Feb. 14, 2002

(30) Foreign Application Priority Data

Jul. 3, 2000 (JP) ........................................ 2000-200757

(51) Int. Cl.[7] ........................................... H01L 21/8242
(52) U.S. Cl. ........................................ 438/253; 438/254
(58) Field of Search ................................... 438/253–256, 438/396–399

(56) References Cited

U.S. PATENT DOCUMENTS 5,888,877 A * 3/1999 Dennison et al. ........... 438/243
5,966,611 A * 10/1999 Jost et al. ................... 438/254
6,015,733 A * 1/2000 Lee et al. ................... 438/253

FOREIGN PATENT DOCUMENTS

| JP | 8-203999 | 8/1996 |
| JP | 11-284139 | 10/1999 |

* cited by examiner

*Primary Examiner*—Jey Tsai
(74) *Attorney, Agent, or Firm*—McDermott, Will & Emery

(57) ABSTRACT

A method of manufacturing a semiconductor device is provided. A polysilicon film and a rough-surfaced polysilicon film are formed on inter-layer insulating film including side and bottom surfaces of openings formed in inter-layer insulating film. A photoresist is formed on the rough-surfaced polysilicon film. The photoresist, the rough-surfaced polysilicon film and the polysilicon film that are located on the top surface of inter-layer insulating film are removed by the CMP method. The polysilicon film and rough-surfaced polysilicon film are etched in a predetermined atmosphere to make the position of the top end of storage nodes lower than the top surface of inter-layer insulating film.

2 Claims, 14 Drawing Sheets

METHOD OF MANUFACTURING A SEMICONDUCTOR DEVICE HAVING A CAPACITOR

BACKGROUND OF THE INVENTION

1. Field of the Invention

The present invention relates to a method of manufacturing a semiconductor device, and in particular to a method of manufacturing a semiconductor device having a reliable capacitor.

2. Description of the Background Art

In recent years, demand for semiconductor devices have been increased due to remarkable popularization of information devices such as computers. It has been required for such a semiconductor device, as for the function thereof, to have a large-scale memory capacity and an ability of operating at a high speed. Accordingly, technological developments have been in progress for higher integration, faster responsiveness, and higher reliability.

In a capacitor of a Dynamic Random Access Memory (hereinafter referred to as "DRAM") a three-dimensional structure and a rough-surfaced structure have been employed in order to secure a capacitance. A DRAM in which the rough-surfaced structure is applied in a cylindrical capacitor will be described below.

Referring to FIG. 20, a well implant layer 102 and isolation insulating films 103 are formed on a P-type silicon substrate 101. Thereafter, Polysilicon films 106a, 106b, silicide films 107a, 107b and insulating films 108a, 108b are respectively formed, with gate insulating films 105a, 105b interposed, on a region between isolation insulating films 103.

Drain regions 104a, 104b and 104c are respectively formed, for example, by introducing an impurity with an ion implantation method, using insulating films 108a, 108b and so forth as masks. Side wall insulating films 109a, 109b are respectively formed on side surfaces of polysilicon films 106a, 106b, silicide films 107a, 107b and insulating films 108a, 108b. Thus, gate electrodes including polysilicon films 106a, 106b and silicide films 107a, 107b are respectively formed.

An inter-layer insulating film 110 is formed on silicon substrate 101 by CVD (Chemical Vapor Deposition) method so as to cover the gate electrodes. A bit-line contact hole 110a which exposes the surface of source/drain region 104b is formed on the inter-layer insulating film 110. A polysilicon film 111, a silicide film 112 and an insulating film 114 are formed in bit-line contact hole 110a. A side wall insulating film 115 is formed on the side surfaces of polysilicon film 111, silicide film 112 and insulating film 114. Thus, a bit line 113 including polysilicon film 111 and silicide film 112 is formed.

An inter-layer insulating film 116 is further formed on inter-layer insulating film 110 so as to cover bit line 113. Storage node contact holes 116a, 116b, respectively exposing the surfaces of source/drain regions 104a, 104c are formed in inter-layer insulating films 116 and 110. Polysilicon plugs 117a and 117b are respectively formed to fill in storage node contact holes 116a and 116b.

An inter-layer insulating film 118 is further formed on inter-layer insulating film 116. Openings 118a, 118b respectively exposing the surfaces of polysilicon plugs 117a, 117b are formed on inter-layer insulating film 118. Thereafter, a polysilicon film 119 is formed on inter-layer insulating film 118 including the side and bottom surfaces of openings 118a, 118b. A rough-surfaced polysilicon film 120 is formed on poly-silicon film 119.

Referring to FIG. 21, a photoresist 121 is applied to rough-surfaced polysilicon film 120. Next, referring to FIG. 22, the entire surface of photoresist 121 is etched to remove photoresist 121 located above the top surface of inter-layer insulating film 118 and to leave photoresist 121 only in openings 118a, 118b.

Referring to FIG. 23, for example, by dry etching, for example, polysilicon film 119 and rough-surfaced polysilicon film 120 exposed on the top surface of inter-layer insulating film 118 are removed. Thereafter, as shown in FIG. 24, photoresist 121 that has been left in openings 118a, 118b is removed. Thus, storage nodes 122a, 122b including polysilicon films 119a, 119b and rough-surfaced polysilicon films 120a, 120b are respectively formed. A dielectric film 123 is then formed on rough-surfaced polysilicon films 120a, 120b.

Referring now to FIG. 25, a cell plate 124 including, for example, a polysilicon film is formed on dielectric film 123. An inter-layer insulating film 125 is formed so as to cover cell plate 124. A predetermined aluminum interconnection 126 is formed on inter-layer insulating film 125. Thus, the main part of the DRAM is completed.

However, a problem as described below lies in the above-described method of manufacturing a semiconductor device. When storage nodes 122a, 122b of the capacitor are formed, polysilicon film 119 and rough-surfaced polysilicon film 120 located above inter-layer insulating film 118 are removed by dry etching in the step shown in FIG. 23.

This may make the top end portions of storage nodes 122a, 122b be pointed as shown in FIG. 26, which may degrade the reliability of dielectric films to be formed thereupon. As a result, the reliability of the capacitor may be deteriorated. Moreover, the pointed portions of storage nodes 122a, 122b may be broken off in the subsequent processes, causing a pattern defect, which would disadvantageously lower the yield.

Further, a process of increasing the particle size of a rough-surfaced polysilicon film may be employed in order to secure the capacitance of the capacitor. In such a case, as shown in FIGS. 27 and 28, an amorphous silicon film 131 is formed, with a relatively thin insulating film 130 interposed, on a polysilicon film 129.

Thereafter, by a predetermined thermal process, amorphous silicon film 131 is made rough, forming a rough-surfaced polysilicon film 132, as shown in FIG. 29. It is noted that insulating film 130 would disappear by the thermal process. Through such a process, particles of rough-surfaced polysilicon film 132 will be increased in size. In such a case, however, adhesiveness between rough-surfaced polysilicon film 132 and polysilicon film 129 is insufficient so that the particles of rough-surfaced polysilicon film 132 may be separated from the surface of polysilicon film 129. Thus, the capacitance of the capacitor may not be sufficiently secured, which would lower the reliability of the capacitor.

SUMMARY OF THE INVENTION

The present invention is directed to solve the problems described above. It is an object of the present invention to provide a method of manufacturing a semiconductor device in which a reliable capacitor is secured.

The first aspect of the method of manufacturing the semiconductor device according to the present invention includes the steps below. An insulating film is formed on a semiconductor substrate. An opening is formed in the insulating film. A conductive layer is formed on the insulating film including side and bottom surfaces of the opening. A coating layer is formed on the conductive layer including an inner side of the opening. A predetermined removal process is performed on the coating layer and the conductive layer that are located on the insulating film, to make a top end of the conductive layer lower than a top surface of the insulating film to form a first electrode portion. A second electrode portion is formed, with a dielectric film interposed, on the first electrode portion.

This manufacturing method makes the top end of the conductive layer lower than the top surface of the insulating film in the step of forming the first electrode portion, so that the top end portion of the conductive layer will not protrude from the top surface of the insulating film, and thus breakage of the top end portion can be prevented, while no residue or the like of the conductive layer is left and the conductive layer on the insulating film is completely removed. This suppresses generation of pattern defects and forms the first electrode portion with high reliability, improving the reliability of the capacitor including the first electrode portion, the dielectric film and the second electrode portion.

Preferably, the predetermined removal process in the step of forming the first electrode portion includes a first step for removing the coating layer and the conductive layer at a substantially same rate so that a top surface of the insulating film and surfaces of the coating layer and the conductive layer exposed at an opening end of the opening are aligned, and a second step for removing a portion of the conductive layer located adjacent to the opening end of the opening, substantially leaving the insulating layer.

In this case, the top surface of the insulating layer and the surfaces of the coating layer and the conductive layer, exposed at the opening end of the opening, can easily be made coplanar by the first step, so that the protrusion and breakage of the top end portion of the conductive layer can be prevented. Further, the residue of the conductive layer or the coating layer on the insulating film can be completely removed by the second step.

It is also preferable that the first step includes a step of removing the coating layer and the conductive layer located on a top surface of the insulating layer by a chemical mechanical polishing method.

In this case, the top surface of the insulating layer and the surfaces of the coating layer and the conductive layer that are exposed on the opening end surface of the opening can be aligned.

It is further preferable that the first step includes a step of removing the coating layer and the conductive layer under an atmosphere including $CF_4$ and excess $O_2$.

In this case, the top surface of the insulating film and the surfaces of the coating layer and the conductive layer that are exposed on the opening end of the opening can be aligned by a commonly-used etching device, not necessarily using a chemical mechanical polishing device.

More preferably, the second step includes a step of removing the conductive layer in an atmosphere of gas including $CF_4$ and $O_2$.

In this case, only the conductive layer can easily be etched without substantial etching of the insulating film, and hence the top end of the conductive layer can be made lower than the position of the top surface of the insulating film.

Preferably, the method of manufacturing a semiconductor device includes a step of removing the insulating film located on an outer side of the first electrode portion after forming the first electrode portion and before forming the dielectric film.

In this case, in addition to an inner surface of the first electrode portion, an outer surface of the first electrode portion may be overlapped with the second electrode portion, advantageously increasing the capacitance of the capacitor.

The second aspect of the method of manufacturing the semiconductor device according to the present invention includes the steps below. A first electrode portion is formed on a main surface of a semiconductor substrate. A second electrode portion is formed, with a dielectric film interposed, on the first electrode portion. The step of forming the first electrode portion includes steps of forming a first layer, forming spots that will be an insulating layer on the first layer, forming a second layer on the insulating layer, and performing a thermal process to the second layer for roughening the surface thereof.

According to this manufacturing method, adhesiveness between the roughened second layer and the first layer is improved to eliminate a possibility that the second layer is easily separated from the first layer, so that reliability of the semiconductor device including a capacitor having the first electrode portion, dielectric film and the second electrode portion is improved.

Preferably, the step of forming the insulating layer includes a step of forming by a chemical oxidation method.

In this case, the insulating layer is grown as spots at an early stage of the growth of the insulating layer on the first layer.

To specify the types of the films, the first layer includes a polysilicon film, and the second layer includes an amorphous silicon film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
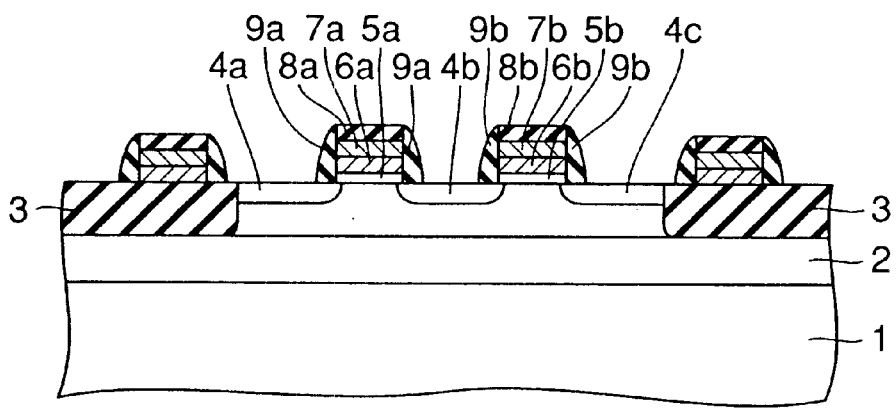
FIG. 1 is a sectional view showing a step of a method of manufacturing a semiconductor device according to the first embodiment of the present invention.

A method of manufacturing a DRAM is described as an example of a method of manufacturing a semiconductor device according to the first embodiment of the present invention. Referring to FIG. 1, a well implant film 2 and isolation insulating films 3 are formed on a silicon substrate 1. A silicon oxide film, a polysilicon film and an insulating film (neither of them is shown) are successively formed on silicon substrate 1. Predetermined photolithography and etching are performed on the silicon oxide film, the polysilicon film and the insulating film, to respectively form polisilicon films 6a, 6b, silicide films 7a, 7b, and insulating films 8a, 8b, with gate insulating films 5a, 5b interposed, on a region between isolation insulating films 3.

Source/drain regions 4a–4c are respectively formed by implanting ions having a predetermined conductivity type, using insulating films 8a, 8b as masks. Side wall insulating films 9a, 9b are respectively formed on the side surfaces of polysilicon films 6a, 6b, silicide films 7a, 7b and insulating films 8a, 8b. Thus, gate electrode portions including polisilicon films 6a, 6b and silicide films 7a, 7b are respectively formed.

Figure 2:
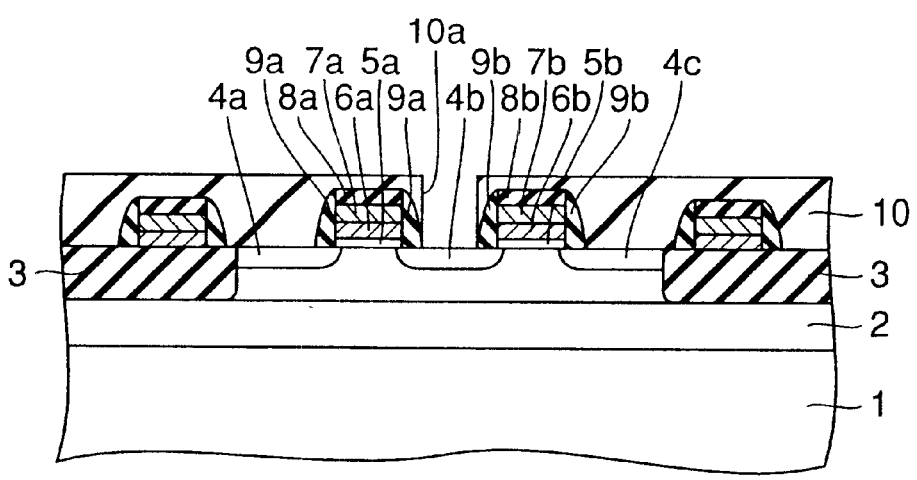
FIG. 2 is a sectional view showing a step in the first embodiment, following the step shown in FIG. 1.
Figure 3:
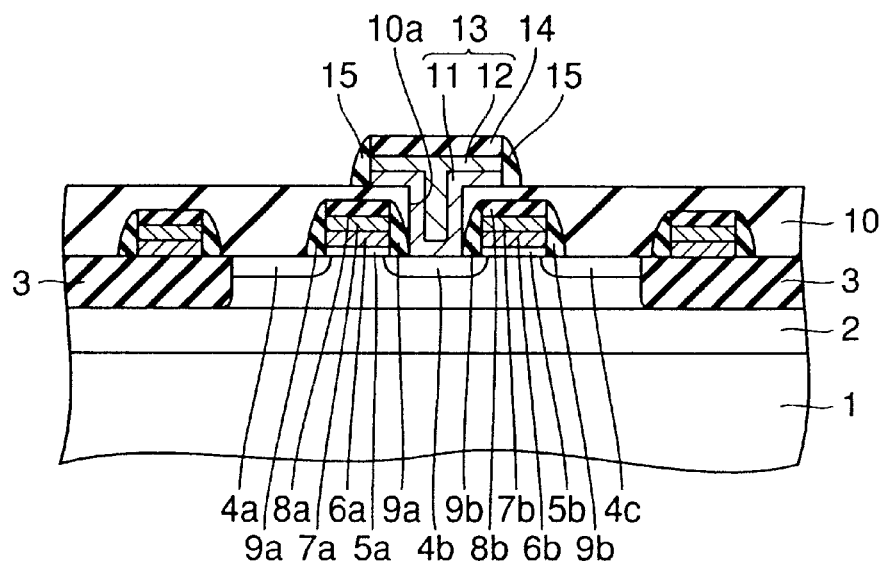
FIG. 3 is a sectional view showing a step in the first embodiment, following the step shown in FIG. 2.

Referring now to FIG. 2, an inter-layer insulating film 10 is formed. A bit-line contact hole 10a is formed, exposing the surface of source/drain region 4b, on inter-layer insulating film 10. Thereafter, as shown in FIG. 3, a polisilicon film, a silicide film and an insulating film (neither of them is shown) are formed to fill in bit-line contact hole 10a. Predetermined photolithography and etching are performed on the insulating film, the silicide film and the polysilicon film to form a bit line 13 including a polysilicon film 11 and a silicide film 12. A side wall insulating film 15 is formed on the side surfaces of bit line 13.

Figure 4:
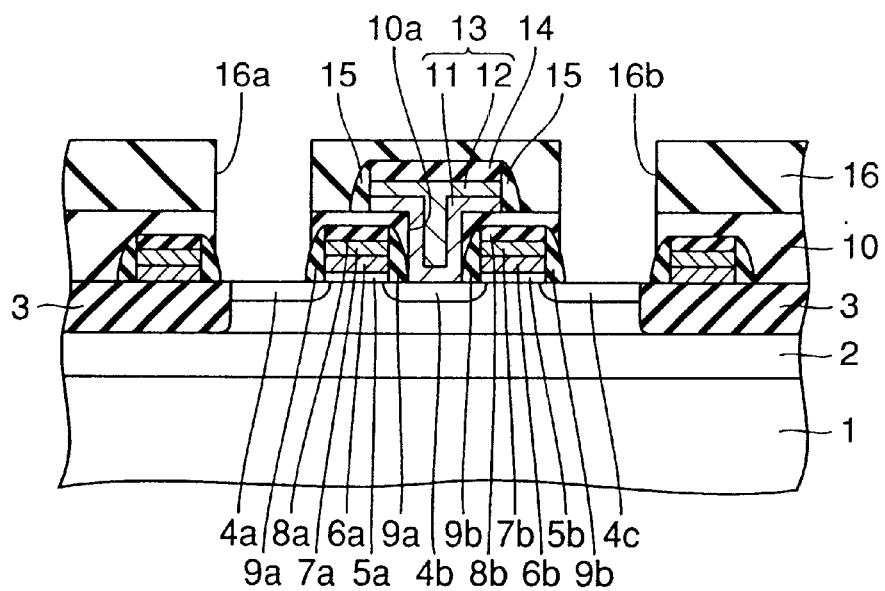
FIG. 4 is a sectional view showing a step in the first embodiment, following the step shown in FIG. 3.

Referring to FIG. 4, an inter-layer insulating film 16 is further formed on inter-layer insulating film 10 so as to cover bit line 13. Storage node contact holes 16a, 16b are formed, exposing the surfaces of source/drain regions 4a, 4c respectively.

Figure 5:
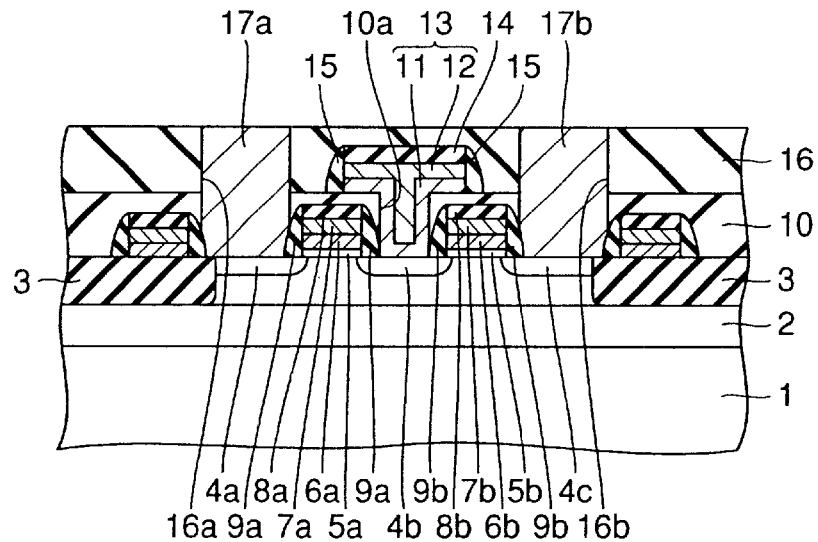
FIG. 5 is a sectional view showing a step in the first embodiment, following the step shown in FIG. 4.

Referring to FIG. 5, a polysilicon film (not shown) is formed on inter-layer insulating film 16 to fill in storage node contact holes 16a, 16b. The entire surface of the polysilicon film is etched to respectively form polysilicon plugs 17a, 17b within storage node contact holes 16a, 16b.

Figure 6:
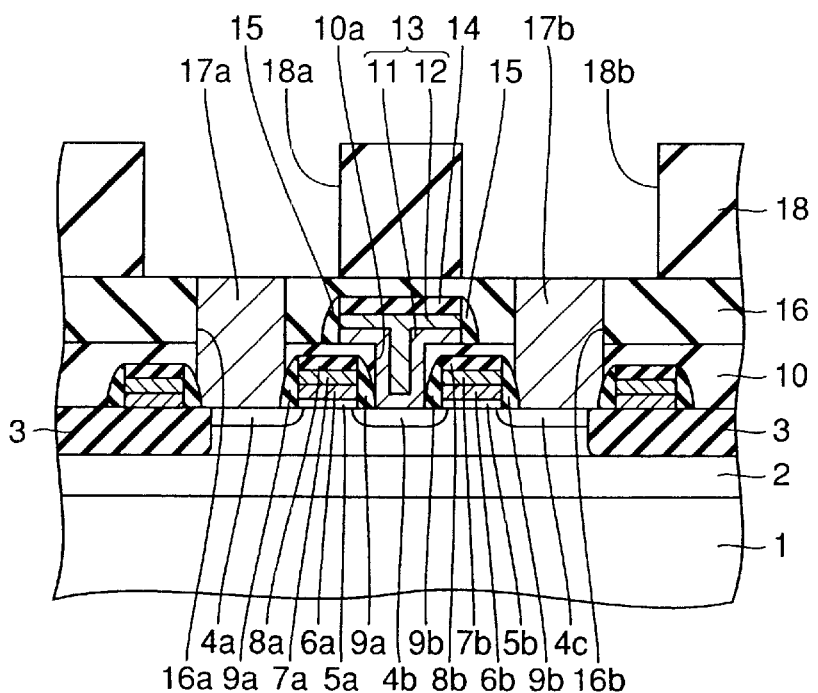
FIG. 6 is a sectional view showing a step in the first embodiment, following the step shown in FIG. 5.
Figure 7:
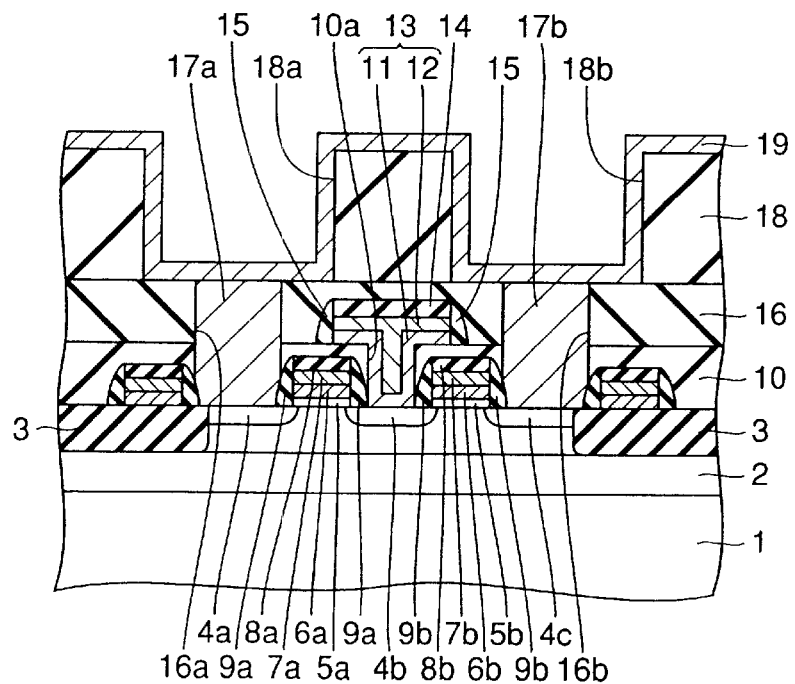
FIG. 7 is a sectional view showing a step in the first embodiment, following the step shown in FIG. 6.

Referring to FIG. 6, inter-layer insulating film 18 is further formed on inter-layer insulating film 16. Predetermined photolithography and etching are performed on inter-layer insulating film 18 to form openings 18a, 18b exposing the surfaces of polysilicon plugs 17a, 17b respectively. Referring to FIG. 7, a polysilicon film 19 is formed on inter-layer insulating film 18 including the side and bottom surfaces of openings 18a, 18b.

Figure 8:
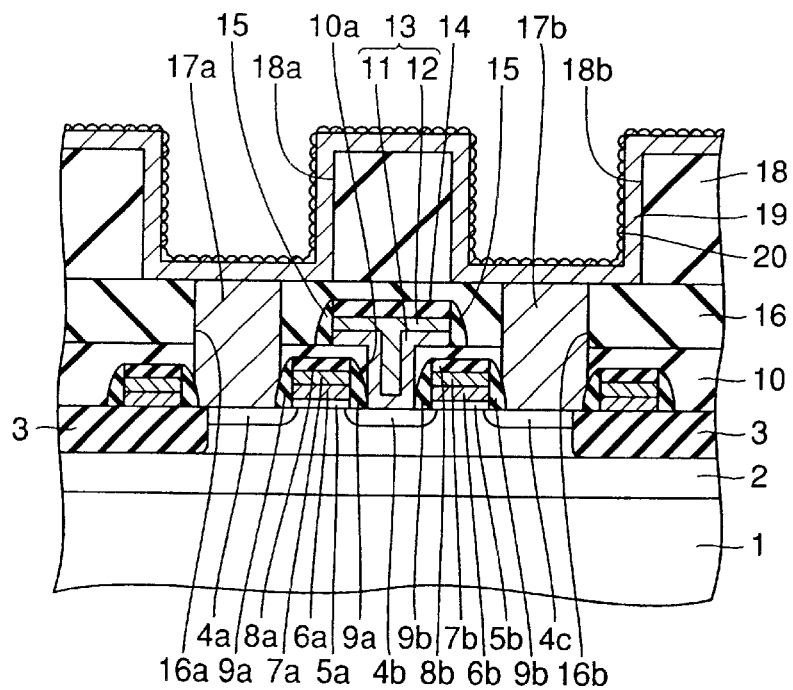
FIG. 8 is a sectional view showing a step in the first embodiment, following the step shown in FIG. 7.
Figure 9:
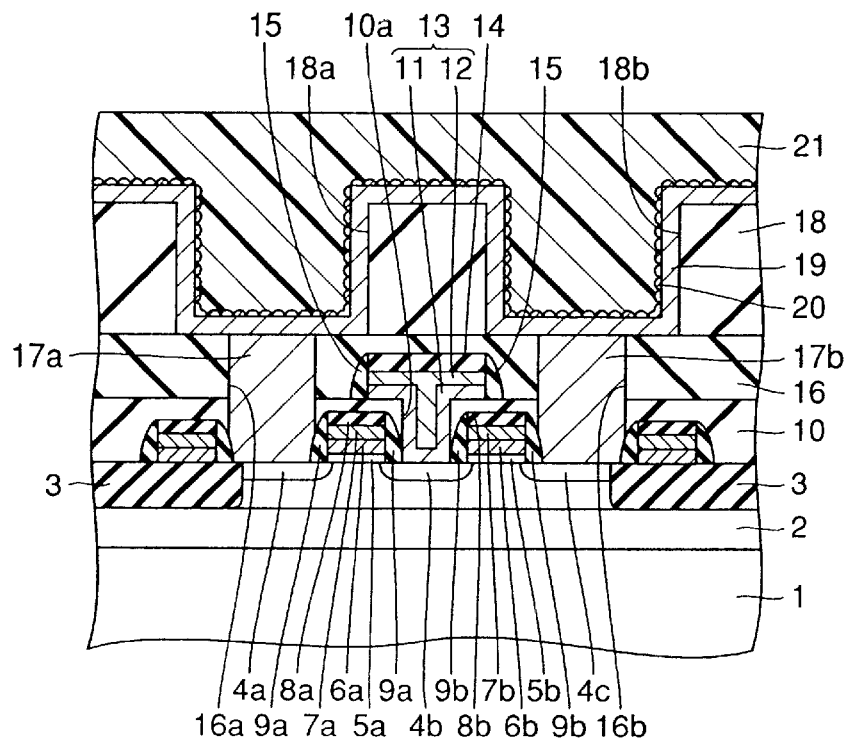
FIG. 9 is a sectional view showing a step in the first embodiment, following the step shown in FIG. 8.

Referring to FIG. 8, an amorphous silicon film (not shown) is formed on polysilicon film 19. Thermal process is performed on the amorphous silicon film at a temperature of approximately 600° C. in a vacuum to form a rough-surfaced polysilicon film 20. Referring to FIG. 9, a photoresist 21 is applied onto rough-surfaced polysilicon film 20 so as to fill in openings 18a, 18b.

Figure 10:
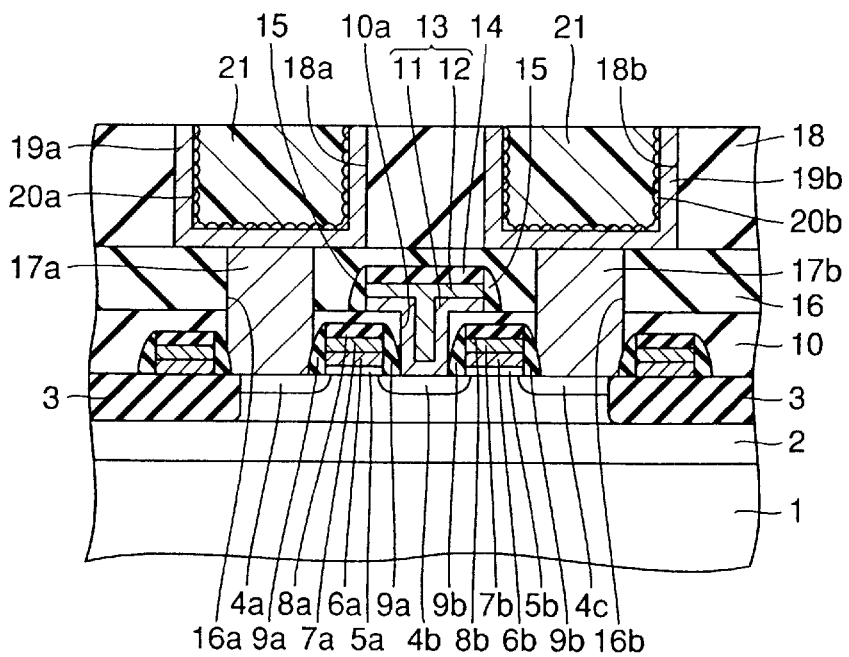
FIG. 10 is a sectional view showing a step in the first embodiment, following the step shown in FIG. 9.
Figure 11:
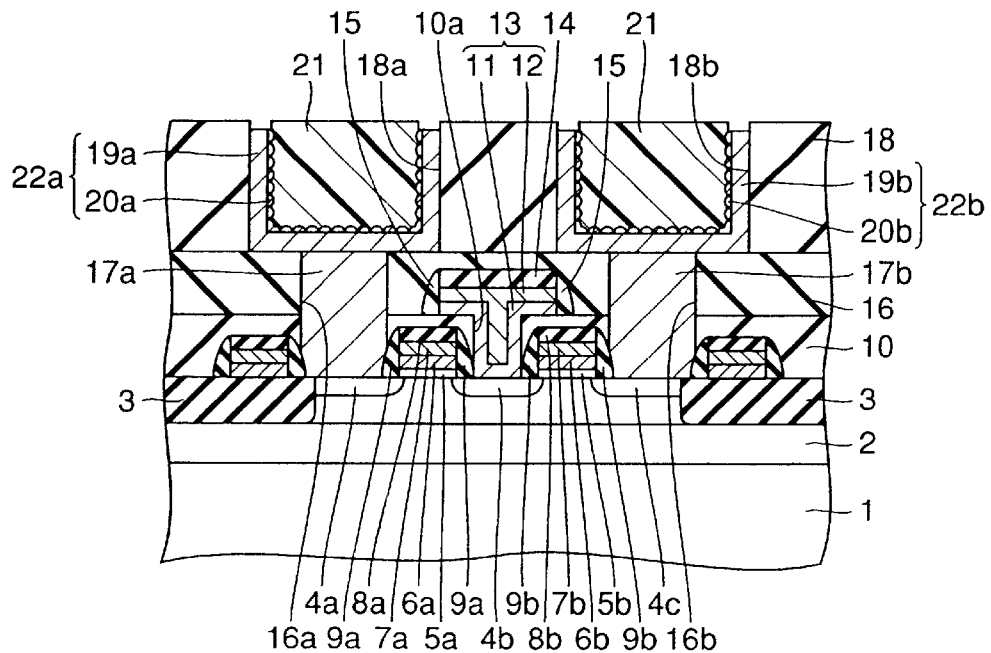
FIG. 11 is a sectional view showing a step in the first embodiment, following the step shown in FIG. 10.

Referring now to FIG. 10, polysilicon film 19, rough-surfaced polysilicon film 20 and photoresist 21 that are located above the top surface of inter-layer insulating film 18 are polished and removed by CMP (Chemical Mechanical Polishing) method. Referring to FIG. 11, by etching under the atmosphere of gas including $CF_4$ and $O_2$, the portions of polysilicon films 19a, 19b and rough-surfaced polysilicon films 20a, 20b located adjacent to the opening end of openings 18a, 18b are removed, subsequently leaving photresist 21. This makes the top ends of polysilicon films 19a, 19b and rough-surfaced polysilicon films 20a, 20b lower than the top surface of inter-layer insulating film 18. Storage nodes 22a, 22b are thus formed.

Figure 12:
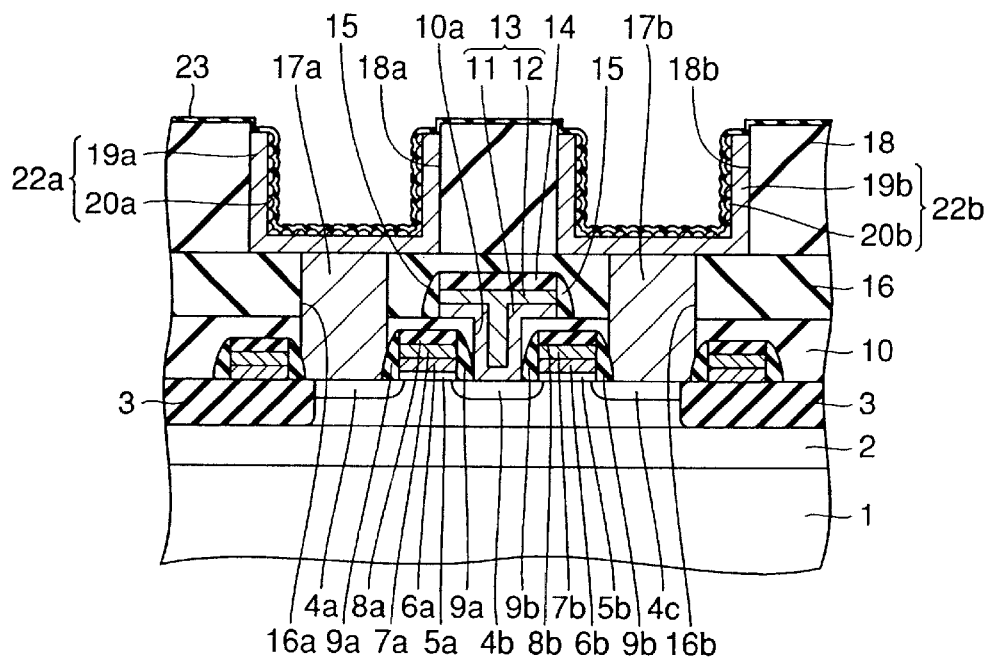
FIG. 12 is a sectional view showing a step in the first embodiment, following the step shown in FIG. 11.
Figure 13:
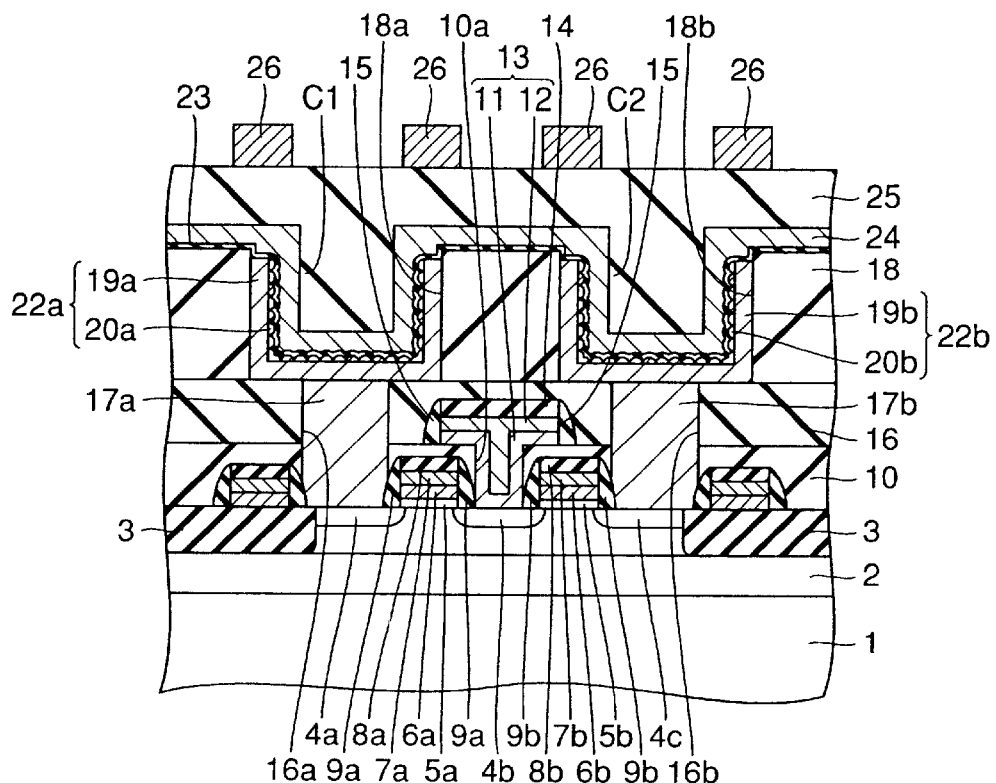
FIG. 13 is a sectional view showing a step in the first embodiment, following the step shown in FIG. 12.

Referring to FIG. 12, photoresist 21 is removed. Thereafter, a dielectric 23 is formed on rough-surfaced polysilicon films 20a, 20b. Referring to FIG. 13, a cell plate 24 including, for example, a polysilicon film is formed on dielectric film 23. Thus, capacitors C1 and C2 including storage nodes 22a, 22b, dielectric film 23 and cell plate 24 are respectively formed.

An inter-layer insulating film 25 is formed to cover capacitors C1 and C2. An aluminum film (not shown) is formed on inter-layer insulating film 25 by a sputtering method or the like. Predetermined photolithography and etching are preformed on the aluminum film to form an aluminum interconnection 26. Thus, the main part of DRAM is completed.

By the manufacturing method described above, in a step shown in FIG. 10, photoresist 21, rough-surfaced polysilicon film 20 and polysilicon film 19 are polished by the CMP method to attain substantially the same removal rate for each of the above. Thus, the top surface of inter-layer insulating film 18 and the surfaces of photoresist 21, rough-surfaced polysilicon film 20 and polysilicon film 19, exposed at the opening ends of openings 18a, 18b, will be coplanar, preventing the protrusion and breakage of the top ends of rough-surfaced polysilicon film 20 and polysilicon film 19.

Further, in the step shown in FIG. 11, etching is performed under an atmosphere of gas including $CF_4$ and $O_2$, to remove the top end portions of polysilicon films 19a, 19b and rough-surfaced polysilicon films 20a, 20b, which are to be storage nodes 22a, 22b, exposed with photoresist 21 substantially remained. This makes the position of the top end of storage nodes 22a, 22b lower than the top surface of inter-layer insulating film 18. Thus, the residue of polysilicon film 19 and rough-surfaced polysilicon film 20 can be completely removed., As a result, generation of pattern defect is suppressed and highly reliable storage nodes 22a, 22b are formed, improving reliability of capacitors C1 and C2.

In the present embodiment, resist 21, rough-surfaced polysilicon film 20 and polysilicon film 19 are removed by the CMP method in the step shown in FIG. 10. Instead of the CMP method, etching may be performed, as long as it is under an etch condition such that photoresist 21, rough-surfaced polysilicon film 20 and polysilicon film 19 have approximately the same etching rate, in the atmosphere including $CF_4$ and excess $O_2$ to align the positions of the top surface of the exposed inter-layer insulating film 18 and the respective surfaces of photoresist 21, rough-surfaced polysilicon film 20 and polysilicon film 19 which are exposed at the opening ends of opening portions 18a, 18b.

As a result, protrusion and breakage of the top ends of rough-surfaced polysilicon film 20 and polysilicon film 19 can be prevented. Moreover, removal will be possible by a commonly-used etching device, not necessarily using a chemical mechanical polishing device.

Second Embodiment

According to the method described in the first embodiment, protrusion and breakage of the top ends of rough-surfaced polysilicon film 20 and polysilicon film 19, which are to be storage nodes 22a, 22b, can be prevented. Thus, the top end portions of storage nodes 22a, 22b can be prevented from being broken off, so that removal of inter-layer insulating film 18 located on the outside of storage nodes 22a, 22b is enabled.

Figure 14:
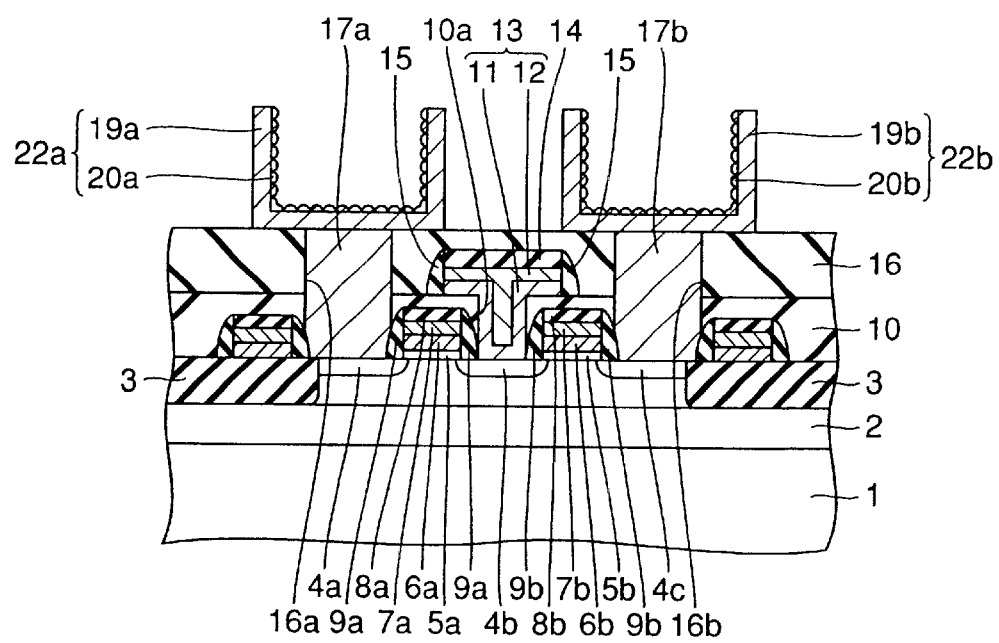
FIG. 14 is a sectional view showing a step of a method of manufacturing a semiconductor device according to the second embodiment of the present invention.

The second embodiment of the present invention describes an example where such inter-layer insulating film 18 is removed. First, photoresist 21 is removed in a step shown in FIG. 11 which has been described in the first embodiment, and then inter-layer insulating film 18 located on the outside of storage nodes 22a, 22b is removed as shown in FIG. 14.

Figure 15:
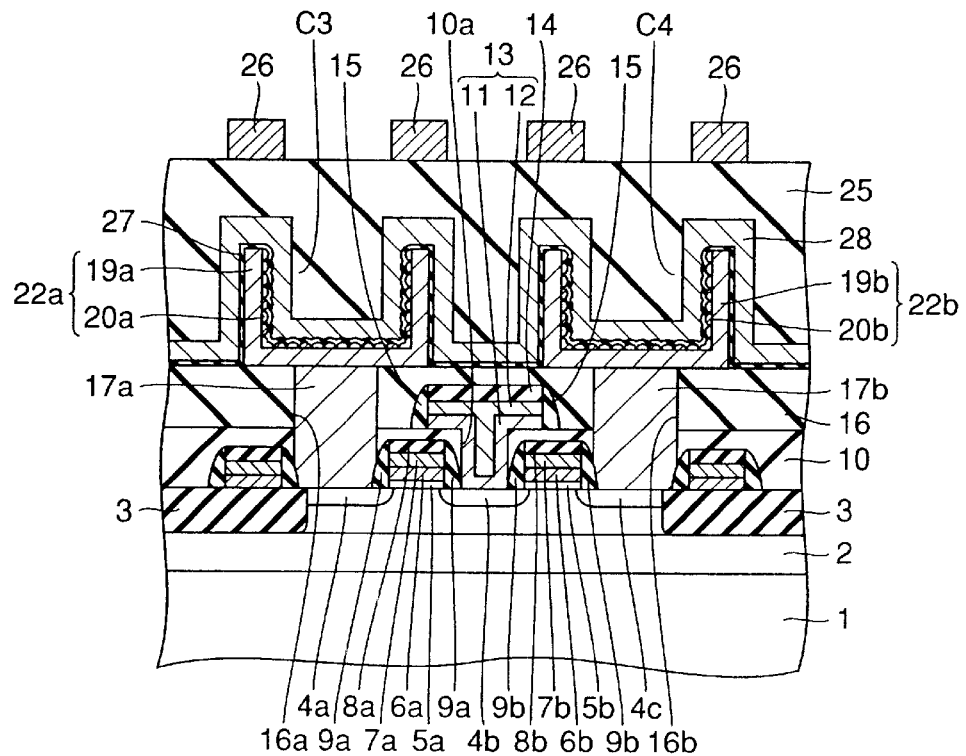
FIG. 15 is a sectional view showing a step in the first embodiment, following the step shown in FIG. 14.

Referring to FIG. 15, a cell plate 28 including a polysilicon film or the like is formed, with a dielectric film 27 interposed, on storage nodes 22a, 22b. This forms capacitors C3, C4 including storage nodes 22a, 22b, dielectric film 27 and cell plate 28. Inter-layer insulating film 25 is formed to cover capacitors C3, C4. Aluminum interconnection 26 is formed on inter-layer insulating film 25. Thus, the main part of the DRAM is completed.

With the manufacturing method described above, the tip end portions of storage nodes 22a, 22b cannot be broken off, so that inter-layer insulating film 18 located on the outside of storage nodes 22a, 22b can be removed. Thus, in addition to the inner surfaces of storage nodes 22a, 22b, the outer surfaces thereof can also be overlapped with cell plate 28, further increasing the capacitance of capacitors C3, C4, and hence refresh property, soft error resistivity and operational margin in DRAM can further be improved.

Third Embodiment

A method of manufacturing a semiconductor device according to the third embodiment of the present invention will be described below. In the present embodiment, an example is described where the particle size of a rough-surfaced polysilicon film in a storage node is increased.

Figure 16:
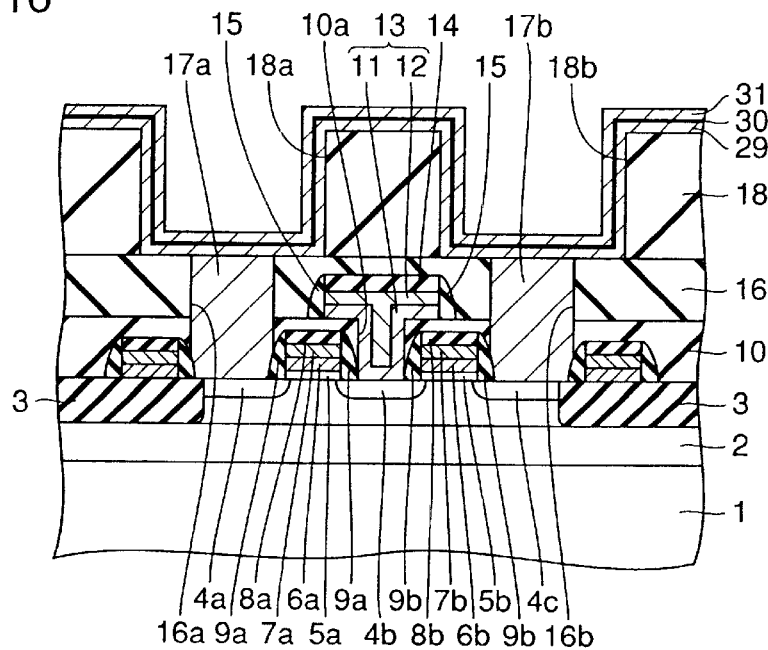
FIG. 16 is a sectional view showing a step of a method of manufacturing a semiconductor device according to the third embodiment of the present invention.

Following the step shown in FIG. 6 which was described in the first embodiment, a polysilicon film 29 is formed on inter-layer insulating film 18 including the side and bottom surfaces of openings 18a, 18b, as shown in FIG. 16. An insulating layer 30 having a film thickness of 0.5 nm is formed on polysilicon film 29.

Figure 17:
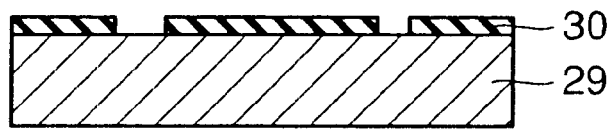
FIG. 17 is a partially enlarged sectional view of the step shown in FIG. 16 in the third embodiment.

When insulating layer 30 is formed, chemical oxidation is performed using, for example, liquid in which ammonia water and aqueous hydrogen peroxide solution are mixed. As shown in FIG. 17, such chemical oxidation facilitates growth of insulating layer 30 in the form of spots at an early stage of the growth of insulating layer 30.

Figure 18:
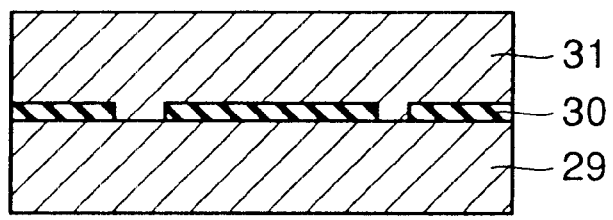
FIG. 18 is a partially enlarged sectional view of the step in the third embodiment, following the step shown in FIG. 17.
Figure 19:
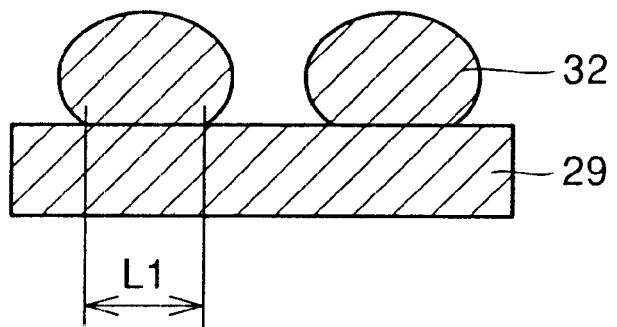
FIG. 19 is a partially enlarged sectional view of the step in the third embodiment, following the step shown in FIG. 18.
Figure 20:
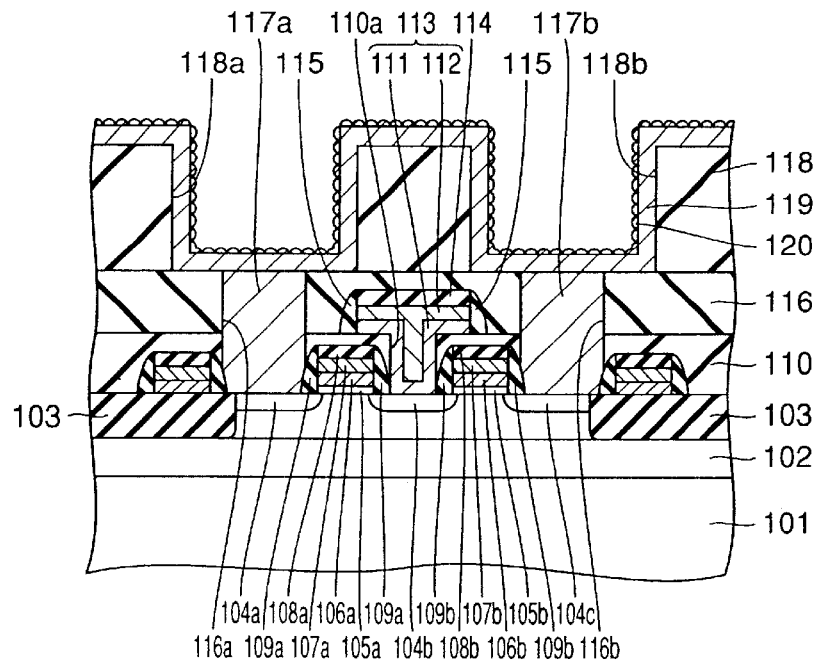
FIG. 20 is a sectional view showing a step of a conventional method of manufacturing a semiconductor device.
Figure 21:
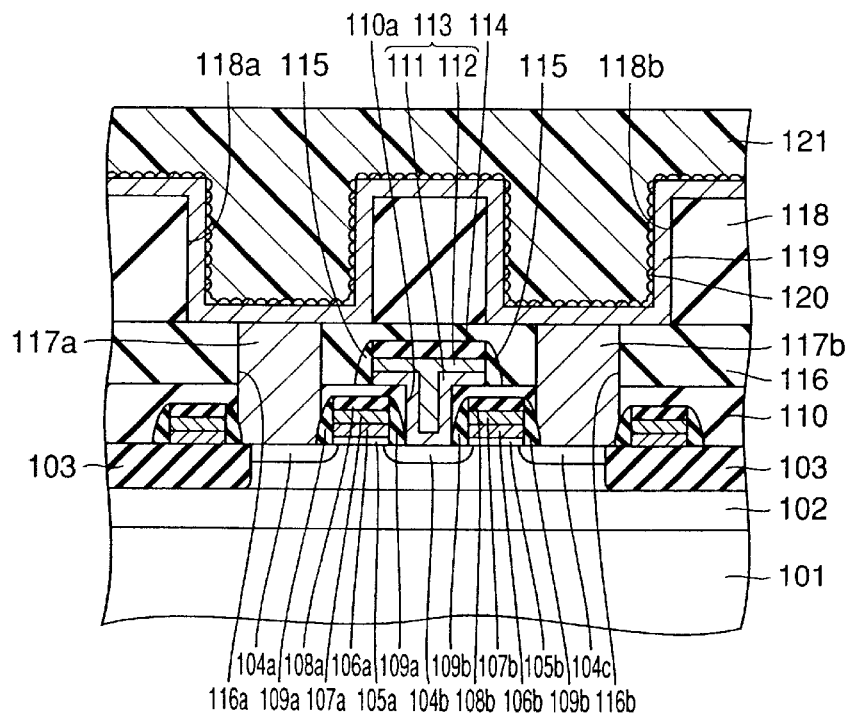
FIG. 21 is a sectional view showing a step following the step shown in FIG. 20.
Figure 22:
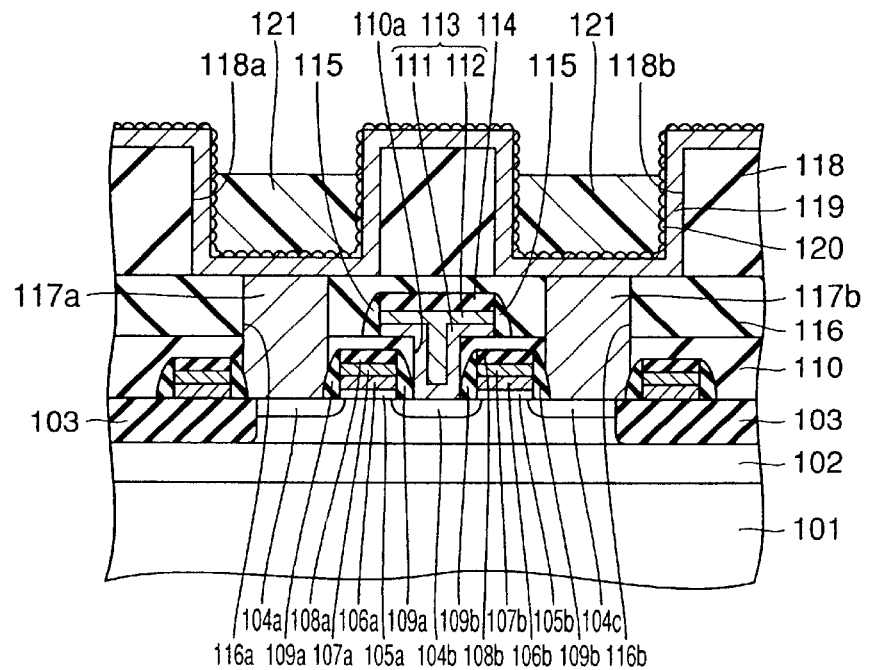
FIG. 22 is a sectional view showing a step following the step shown in FIG. 21.
Figure 23:
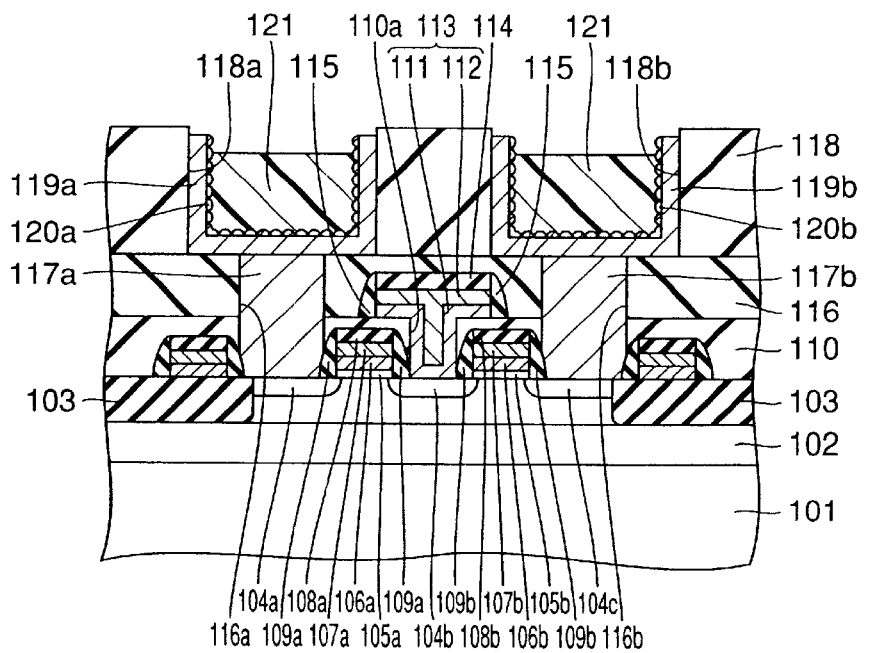
FIG. 23 is a sectional view showing a step following the step shown in FIG. 22.
Figure 24:
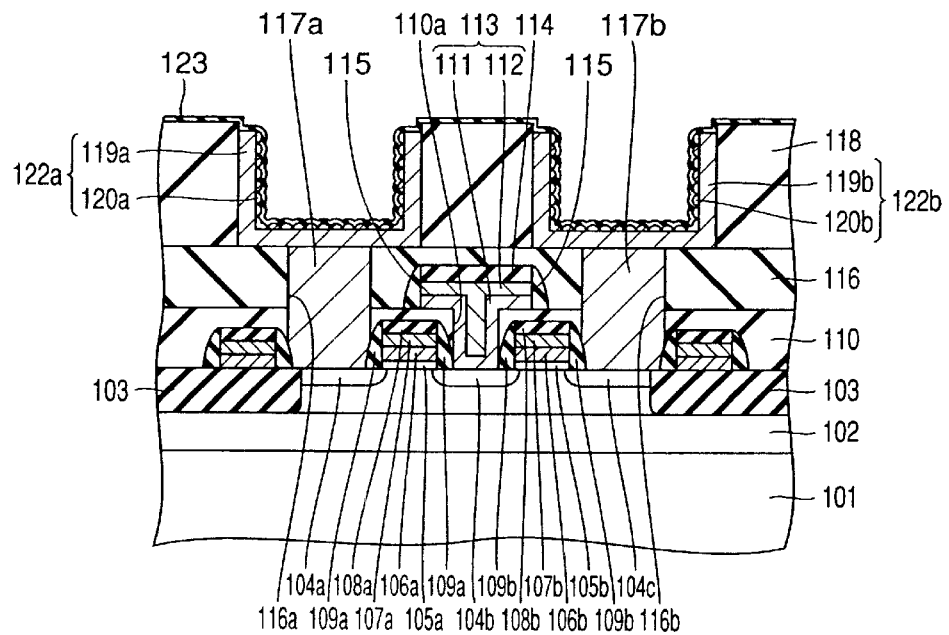
FIG. 24 is a sectional view showing a step following the step shown in FIG. 23.
Figure 25:
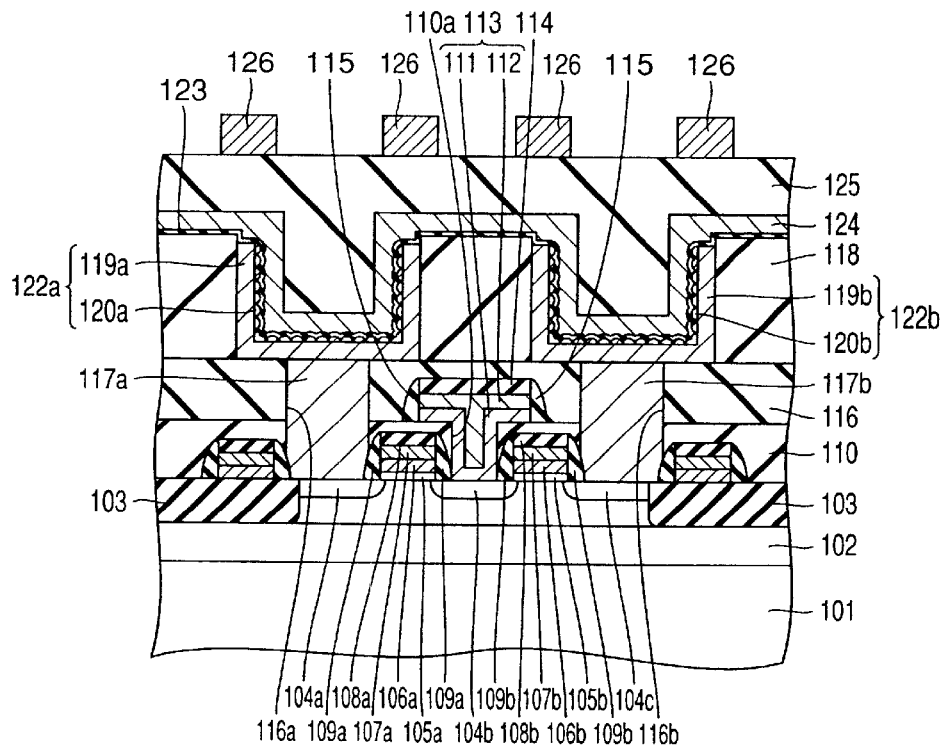
FIG. 25 is a sectional view showing a step following the step shown in FIG. 24.
Figure 26:
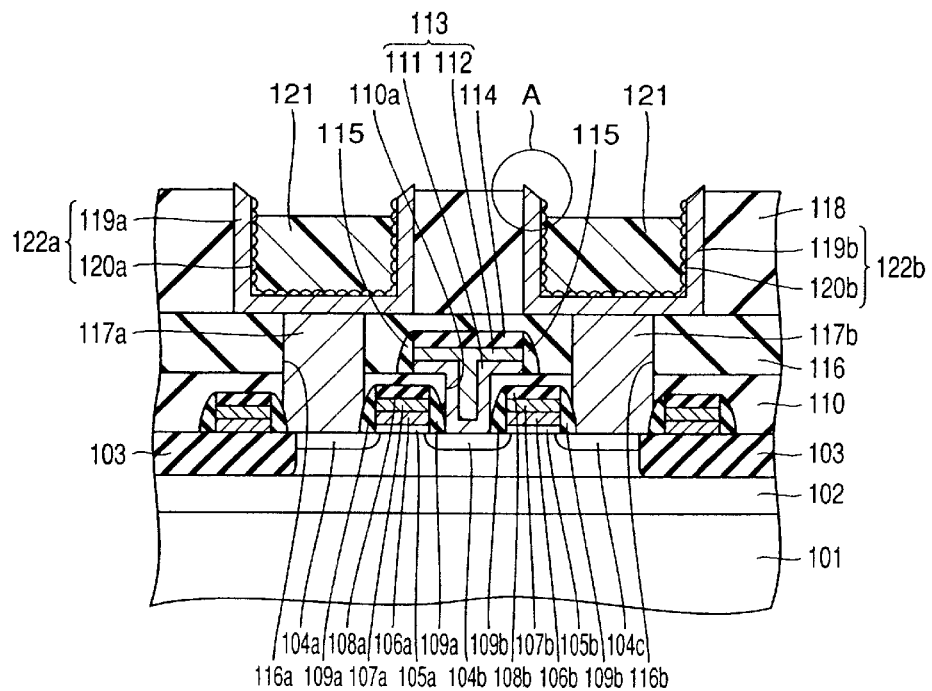
FIG. 26 is a sectional view illustrating a problem of the conventional method of manufacturing a semiconductor device.
Figure 27:
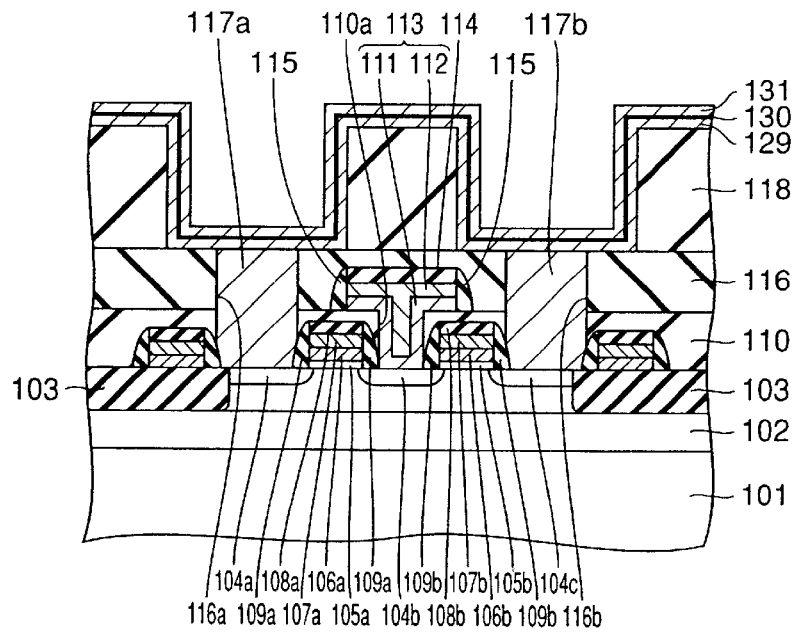
FIG. 27 is a sectional view of a step, illustrating another problem of the conventional method of manufacturing a semiconductor device.
Figure 28:
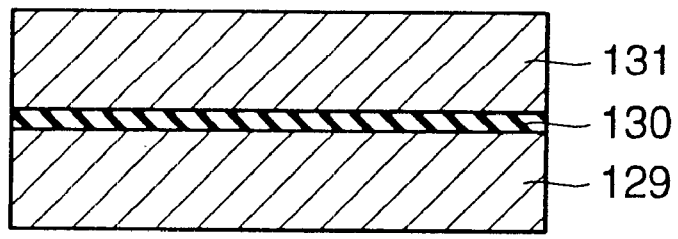
FIG. 28 is a partially enlarged sectional view in the step shown in FIG. 27.

Thereafter, referring to FIG. 18, an amorphous silicon film 31 is formed on the spot-like insulating layer 30. Referring to FIG. 19, a thermal process is performed under a predetermined vacuum and at a temperature of approximately 600° C. to roughen amorphous silicon film 31 to form a rough-surfaced polysilicon film 32.

Figure 29:
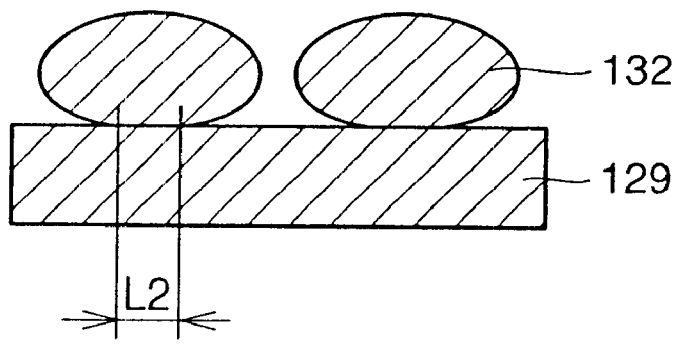
FIG. 29 is a sectional view showing a step following the step shown in FIG. 28.

Referring again to FIG. 18, amorphous silicon film 31 and polysilicon film 29 have portions directly contacting with each other, so that a contact region L1 with polysilicon film 29 is larger than a contact region L2 in the case with a conventional rough-surfaced polysilicon film 132 shown in FIG. 29. This eliminates the possibility that rough-surfaced polysilicon film 32 is easily separated from polysilicon film 29, securing a sufficient capacitance of the capacitor and improving the reliability of the capacitor.

Though the case where insulating layer 30a is formed as spots by a chemical oxidation method has been described in the present embodiment, alternatively, a relatively thin insulating layer may be formed followed by ion implantation method in which, for example, boron or arsenic is implanted into the insulating layer at a dosage of up to $10^{15}/cm^2$. In such a case also, improvement was seen in the adhesiveness between the rough-surfaced polysilicon film and the polysilicon film due to penetration of ions through the insulating layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming an insulating film on a semiconductor substrate;

forming an opening in said insulating film;

forming a conductive layer on said insulating film including side and bottom surfaces of said opening;

forming a coating layer on said conductive layer including an inner side of said opening;

removing said coating layer and said conductive layer at a substantially same rate to align a top surface of said insulating film and surfaces of said coating layer and said conductive layer exposed at an opening end of said opening to be coplanar; under an atmosphere including $CF_4$ and excess $O_2$;

removing a portion of said conductive layer located adjacent to the opening end of said opening, substantially leaving said insulating layer; and forming a second electrode portion, with a dielectric film interposed, on said first electrode portion.

2. The method of manufacturing a semiconductor device according to claim 1, wherein said second step includes a step of removing said conductive layer in an atmosphere of gas including $CF_4$ and $O_2$.

* * * * *